US012716965B2

(12) United States Patent
Guo et al.

(10) Patent No.: US 12,716,965 B2
(45) Date of Patent: Aug. 25, 2026

(54) TRIAXIAL MAGNETIC SENSOR AND MANUFACTURING PROCESS THEREFOR

(71) Applicant: QST CORPORATION LIMITED, Shanghai (CN)

(72) Inventors: Huifang Guo, Shanghai (CN); Yong Xiao, Shanghai (CN)

(73) Assignee: QST CORPORATION LIMITED, Shanghai (CN)

(*) Notice: Subject to any disclaimer, the term of this patent is extended or adjusted under 35 U.S.C. 154(b) by 205 days.

(21) Appl. No.: 18/714,780

(22) PCT Filed: Aug. 23, 2022

(86) PCT No.: PCT/CN2022/114278
§ 371 (c)(1),
(2) Date: May 30, 2024

(87) PCT Pub. No.: WO2023/098159
PCT Pub. Date: Jun. 8, 2023

(65) Prior Publication Data

US 2024/0393412 A1 Nov. 28, 2024

(30) Foreign Application Priority Data

Dec. 1, 2021 (CN) ........................ 202111459362.3

(51) Int. Cl.
*G01R 33/02* (2006.01)
*G01R 33/00* (2006.01)

(52) U.S. Cl.
CPC ..... *G01R 33/0206* (2013.01); *G01R 33/0052* (2013.01)

(58) Field of Classification Search
CPC ............ G01R 33/0206; G01R 33/0052; G01R 33/0017; G01R 33/09; G01R 33/096; G01R 33/10
See application file for complete search history.

(56) References Cited

U.S. PATENT DOCUMENTS

2005/0270020 A1* 12/2005 Peczalski ........... G01R 33/0206 324/252
2009/0027048 A1* 1/2009 Sato ....................... G01R 33/09 29/602.1

(Continued)

FOREIGN PATENT DOCUMENTS

CN 104576922 A 4/2015
CN 105261699 A 1/2016

(Continued)

OTHER PUBLICATIONS

Nov. 1, 2022 International Search Report.

(Continued)

*Primary Examiner* — Akm Zakaria
(74) *Attorney, Agent, or Firm* — Whitestone Law, PLLC

(57) ABSTRACT

Some embodiments relate to a triaxial magnetic sensor and a manufacturing process therefor. The triaxial magnetic sensor includes a substrate forming at least two grooves, a first magnetic sensor mechanism, a second magnetic sensor mechanism and a third magnetic sensor mechanism; the first magnetic sensor mechanism detects the magnetic field in a first direction; the second magnetic sensor mechanism detects the magnetic field in a second direction; the third magnetic sensor mechanism detects the magnetic field in a third direction; the first magnetic sensor mechanism and the second magnetic sensor mechanism are arranged on the surface of the substrate, and the third magnetic sensor mechanism is arranged within the grooves. At least one pair of adjacent grooves are spaced apart by the at least one first magnetic sensor mechanism and/or the at least one second magnetic sensor mechanism.

10 Claims, 7 Drawing Sheets

(56) References Cited

U.S. PATENT DOCUMENTS

| | | | | |
|---|---|---|---|---|
| 2014/0176132 | A1* | 6/2014 | Chen | G01R 33/0017 324/252 |
| 2014/0247042 | A1* | 9/2014 | Lei | G01R 33/0052 324/247 |
| 2015/0008913 | A1 | 1/2015 | Fu et al. | |
| 2018/0031647 | A1* | 2/2018 | Mather | G01R 33/096 |

FOREIGN PATENT DOCUMENTS

| | | | |
|---|---|---|---|
| CN | 14220913 | A | 3/2022 |
| JP | 2002190632 | A | 7/2002 |
| JP | 2004006752 | A | 1/2004 |
| JP | 2006261400 | A | 9/2006 |

OTHER PUBLICATIONS

Nov. 2, 2022 Written Opinion.

English Translation of CN Notification to Grant Patent Right for Invention of priority document CN2022111565541.

CN Notification to Grant Patent Right for Invention of priority document CN2022111565541.

English Translation of CNOA1 of priority document of CN2022111565541.

CNOA1 of priority document of CN2022111565541.

English Translation of JP Decision to Grant a Patent 2024-529906.

JP Decision to Grant a Patent 2024-529906.

English Translation of JP Notice of Reasons for Refusal 2024-529906.

JP Notice of Reasons for Refusal 2024-529906.

English Translation of Korean Patent Office Action 10-2024-7021011.

Korean Patent Office Action 10-2024-7021011.

English Translation of KR Notice of Allowance 10-2024-7021011.

KR Notice of Allowance 10-2024-7021011.

* cited by examiner

TRIAXIAL MAGNETIC SENSOR AND MANUFACTURING PROCESS THEREFOR

CROSS-REFERENCE TO RELATED APPLICATIONS

This application is a national phase filing under 35 C.F.R. § 371 of and claims priority to PCT Patent Application No. PCT/CN2022/114278, filed on Aug. 23, 2022, which claims the priority benefit under 35 U.S.C. § 119 of Chinese Patent Application No. 202111459362.3, filed on Dec. 1, 2021, the contents of which are hereby incorporated in their entireties by reference.

TECHNICAL FIELD

The present disclosure belongs to the technology field of microelectronics, relating to a magnetic sensor and particularly relating to a triaxial magnetic sensor and manufacturing process therefor.

BACKGROUND ART

Traditional triaxial magnetic sensors all adopt discrete X, Y, and Z bridge resistance designs, with the X-axis and Y-axis sensing units in the plane and the Z-axis sensing unit on the slope. However, the concentrated distribution of slopes brings great difficulty to process control.

In view of this, there is an urgent need to design a new type of triaxial magnetic sensor to overcome at least some of the above-mentioned defects present in existing triaxial magnetic sensors.

SUMMARY

The present disclosure provides a triaxial magnetic sensor and a manufacturing process therefor, which can reduce processing errors, improve process windows, and improve overall product yields.

In order to solve the above technical problems, according to one aspect of the present disclosure, the following technical solution is used.

A triaxial magnetic sensor is provided, wherein the triaxial magnetic sensor comprises:

- a substrate, wherein a surface of the substrate is partially concave to form at least two grooves;
- at least one first magnetic sensing mechanism, configured to detect a magnetic field in a first direction;
- at least one second magnetic sensing mechanism, configured to detect a magnetic field in a second direction; and
- at least two third magnetic sensing mechanisms, configured to detect a magnetic field in a third direction, wherein
- the first direction and the second direction can form a plane, the plane corresponds to the surface of the substrate, and the third direction intersects with the surface of the substrate;
- the grooves are all arranged along the first direction, or are all arranged along the second direction, or are arranged partly along the first direction and partly along the second direction;
- the first magnetic sensing mechanism and the second magnetic sensing mechanism are both arranged on the surface of the substrate, the third magnetic sensing mechanisms are arranged inside the grooves, and each of the third magnetic sensing mechanisms corresponds to one of the grooves; in the grooves arranged along the first direction, at least one pair of adjacent grooves are separated by at least one first magnetic sensing mechanism, and/or in the grooves arranged along the second direction, at least one pair of adjacent grooves are separated by at least one second magnetic sensing mechanism.

As one embodiment of the present disclosure, the first magnetic sensing mechanism comprises at least one first magnetic reluctance bar, with each first magnetic reluctance bar extending along the second direction; the second magnetic sensing mechanism comprises at least one second magnetic reluctance bar, with each second magnetic reluctance bar extending along the first direction; the third magnetic sensing mechanism comprises at least one third magnetic reluctance bar, with each third magnetic reluctance bar arranged on a side wall of the corresponding groove; the third magnetic reluctance bars all extend along the first direction, or extend along the second direction, or partly extend along the first direction and partly extend along the second direction.

As one embodiment of the present disclosure, a pseudo-magnetic reluctance bar not connected to a Wheatstone bridge is provided between the first magnetic reluctance bar and the third magnetic reluctance bar that are arranged adjacently, and/or a pseudo-magnetic reluctance bar not connected to a Wheatstone bridge is provided between the second magnetic reluctance bar and the third magnetic reluctance bar that are arranged adjacently.

As one embodiment of the present disclosure, set/reset coils are arranged above or/and below each magnetic reluctance bar, which are configured to generate a magnetic field along an axis of easy magnetization; working electrodes at a set angle to the magnetic reluctance bar are distributed on an upper surface or/and a lower surface of the magnetic reluctance bar.

As one embodiment of the present disclosure, a direction of a current on the magnetic reluctance bar forms an angle of 45° with the axis of easy magnetization of the magnetic reluctance bar.

As one embodiment of the present disclosure, each of the magnetic sensing mechanisms is combined separately to form an independent Wheatstone bridge, with each bridge arm of each Wheatstone bridge composed of at least one magnetic reluctance bar; and several magnetic reluctance bars with a same induction change in response to external magnetic fields form one bridge arm of the Wheatstone bridge, and one Wheatstone bridge comprises two sets of bridge arms with increasing resistance values with external magnetic field input and two sets of bridge arms with decreasing resistance values with external magnetic field input.

As one embodiment of the present disclosure, in a local area, self-test coils are arranged based on a detection magnetic field of the magnetic reluctance bar, wherein the self-test coils are configured to generate a magnetic field in a detection direction corresponding to the magnetic reluctance bar.

According to another aspect of the present disclosure, the following technical solution is used. A manufacturing process for the triaxial magnetic sensor is provided, wherein the manufacturing process comprises:

- arranging a silicon-based substrate or a substrate with circuits;
- forming at least two grooves on a surface of the substrate, wherein a set angle is provided between a side wall of the grooves and the surface of the substrate; arranging the grooves all along a first direction, or along a second direction, or partly along the first direction and partly along the second direction; leaving a mounting space between at least one pair of adjacent grooves in the grooves arranged along the first direction, and/or leaving a mounting space between at least one pair of adjacent grooves in the grooves arranged along the second direction; forming a plane by the first direction and the second direction, with the plane corresponding to the surface of the substrate;

forming an insulating layer on the surface of the substrate and the grooves; and forming a first magnetic sensing mechanism and a second magnetic sensing mechanism on a surface of the insulating layer of the substrate; forming third magnetic sensing mechanisms on a surface of the insulating layer of the grooves; arranging at least one first magnetic sensing mechanism in the mounting space along the first direction and/or arranging at least one second magnetic sensing mechanism in the mounting space along the second direction, wherein the first magnetic sensing mechanism, the second magnetic sensing mechanism, and the third magnetic sensing mechanisms all comprise magnetic materials.

As one embodiment of the present disclosure, the manufacturing process further comprises:

forming a dielectric layer on a surface of the magnetic materials of the first magnetic sensing mechanism, the second magnetic sensing mechanism, and the third magnetic sensing mechanisms;

forming via holes in the dielectric layer on the surface of the magnetic materials;

forming a continuous electrode layer on the surface of the substrate and the side walls of the grooves; and patterning the electrode layer to form working electrodes on the surface of the magnetic material; and the via holes formed in the dielectric layer on the surface of the magnetic materials allow the magnetic materials to contact the subsequently formed working electrodes.

As one embodiment of the present disclosure, the magnetic materials are selected from any one of an anisotropic magnetoresistive material, a giant magnetoresistive material, and a tunnel magnetoresistive material; when forming the magnetic materials, a magnetic field is simultaneously applied to the substrate for annealing so as to induce a magnetization direction of the magnetic materials and enhance the magnetic properties of the magnetic materials.

As one embodiment of the present disclosure, the manufacturing process further comprises:

arranging lead-out terminals at both ends of each magnetic reluctance bar on the surface of the substrate and within the grooves;

arranging self-test coils at a bottom of the grooves, below the substrate, and below the magnetic sensing mechanisms; and arranging set coils or/and reset coils at a top of the grooves, above the substrate, and above the magnetic sensing mechanisms.

The beneficial effects of the present disclosure are described as follows. The present disclosure provides a triaxial magnetic sensor and a manufacturing process therefor, which can reduce processing errors, improve process windows, and improve overall product yields.

DETAILED DESCRIPTION OF EMBODIMENTS

Preferred embodiments of the present disclosure are described in detail below in conjunction with the drawings.

For further understanding of the present disclosure, the preferred embodiments of the present disclosure are described below in connection with embodiments. However, it should be understood that these descriptions are only intended to further illustrate the features and advantages of the present disclosure and not to limit the scope of the claims of the present disclosure.

The description in this section is directed to only a few exemplary embodiments, and the present disclosure is not limited to the scope of the description of the embodiments. In the same or similar prior art, the means for interchanging some technical features with the embodiments are also within the scope of the description and protection of the present disclosure.

The formulation of the steps in the various embodiments in the description is for illustrative purposes only, and the realization of the present disclosure is not limited by the order in which the steps are realized. The term "connection" in the description includes both direct and indirect connections. In the description, "multiple" means two or more.

Figure 1:
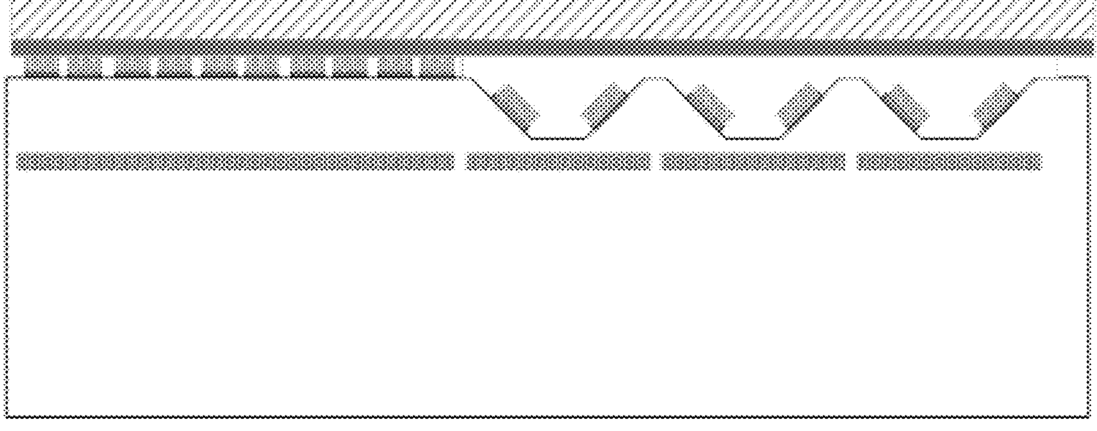
FIG. 1 shows a locally sectional view of an existing triaxial magnetic sensor.
Figure 2:
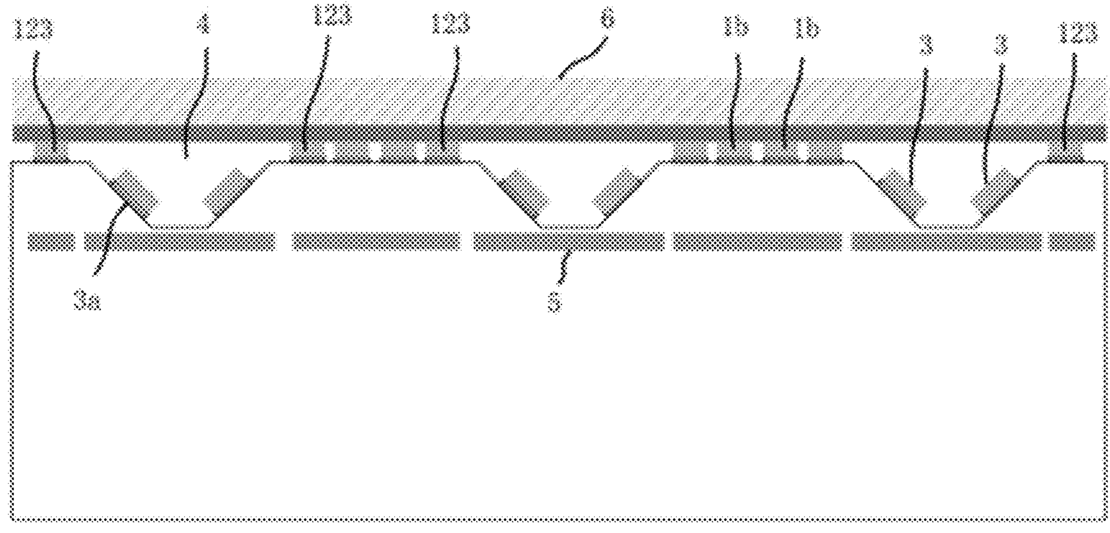
FIG. 2 shows a locally sectional view of a triaxial magnetic sensor in an embodiment of the present disclosure.

The present disclosure discloses a triaxial magnetic sensor, and FIG. 2 shows a locally sectional view of the triaxial magnetic sensor in an embodiment of the present disclosure, which comprises a substrate, at least one first magnetic sensing mechanism, at least one second magnetic sensing mechanism, and at least two third magnetic sensing mechanisms.

Each first magnetic sensing mechanism is configured to detect a magnetic field in a first direction, each second magnetic sensing mechanism is configured to detect a magnetic field in a second direction, and each third magnetic sensing mechanism is configured to detect a magnetic field in a third direction.

The first direction and the second direction can form a plane and the plane corresponds to a surface of the substrate. The third direction intersects the surface of the substrate.

The surface of the substrate is partially concave to form at least two grooves 4. The grooves 4 are all arranged along the first direction, or along the second direction, or partly along the first direction and partly along the second direction.

The first magnetic sensing mechanism and the second magnetic sensing mechanism are both arranged on the surface of the substrate, and the third magnetic sensing mechanisms are arranged inside the grooves 4, with each third magnetic sensing mechanism corresponding to one groove 4 (i.e., one third magnetic sensing mechanism is arranged within one groove 4).

In the grooves 4 arranged along the first direction, at least one pair of adjacent grooves 4 are separated by at least one first magnetic sensing mechanism, and/or in the grooves 4 arranged along the second direction, at least one pair of adjacent grooves 4 are separated by at least one second magnetic sensing mechanism.

For example, if there are three grooves 4 arranged along the first direction, forming two pairs of adjacent grooves 4, at least one first magnetic sensing mechanism can be arranged between the first pair of adjacent grooves 4 so as to separate the first pair of adjacent grooves 4, and/or at least one first magnetic sensing mechanism can be placed between the second pair of adjacent grooves 4 so as to separate the second pair of adjacent grooves 4.

For another example, if there are three grooves 4 arranged along the second direction, forming two pairs of adjacent grooves 4, at least one second magnetic sensing mechanism can be arranged between the first pair of adjacent grooves 4 so as to separate the first pair of adjacent grooves 4, and/or at least one second magnetic sensing mechanism can be placed between the second pair of adjacent grooves 4 so as to separate the second pair of adjacent grooves 4.

At least one pair of adjacent grooves 4 are separated by at least one first magnetic sensing mechanism and/or at least one second magnetic sensing mechanism, so that at least one pair of grooves 4 do not need to be concentratedly and continuously opened, thereby reducing the difficulty of process control.

In one embodiment, for the grooves 4 arranged along the first direction, at least one first magnetic sensing mechanism is arranged between each pair of adjacent grooves 4 so as to separate the adjacent grooves 4; and for the grooves 4 arranged along the second direction, at least one second magnetic sensing mechanism is arranged between each pair of adjacent grooves 4 so as to separate the adjacent grooves 4.

In one embodiment, for the grooves 4 arranged along the first direction, one first magnetic sensing mechanism is arranged between each pair of adjacent grooves 4 so as to separate the adjacent grooves 4; and for the grooves 4 arranged along the second direction, one second magnetic sensing mechanism is arranged between each pair of adjacent grooves 4 so as to separate the adjacent grooves 4.

The first magnetic sensing mechanism comprises at least one first magnetic reluctance bar, with each first magnetic reluctance bar extending along the second direction. In other words, the axial direction of the first magnetic reluctance bar is aligned with the second direction. When the first magnetic sensing mechanism comprises at least two first magnetic reluctance bars, each first magnetic reluctance bar is arranged along the first direction. In an embodiment, the first magnetic sensing mechanism comprises two first magnetic reluctance bars.

The second magnetic sensing mechanism comprises at least one second magnetic reluctance bar, with each second magnetic reluctance bar extending along the first direction. In other words, the axial direction of the second magnetic reluctance bar is aligned with the first direction. When the second magnetic sensing mechanism comprises at least two second magnetic reluctance bars, each second magnetic reluctance bar is arranged along the second direction. In an embodiment, the second magnetic sensing mechanism comprises two second magnetic reluctance bars.

The third magnetic sensing mechanism comprises at least one third magnetic reluctance bar, with each third magnetic reluctance bar arranged on the side wall of the corresponding groove 4. Among the third magnetic reluctance bars, the third magnetic reluctance bar arranged in the grooves 4 that are arranged along the first direction extends along the second direction. In other words, the axial direction of the third magnetic reluctance bars aligns with the second direction. The third magnetic reluctance bar arranged in the grooves 4 that are arranged along the second direction extends along the first direction. In other words, the axial direction of the third magnetic reluctance bars aligns with the first direction. The third magnetic reluctance bar is arranged in the same direction as its corresponding groove 4. The third magnetic reluctance bars are all arranged along the first direction, or along the second direction, or partly along the first direction and partly along the second direction. In an embodiment, the third magnetic sensing mechanism comprises two third magnetic reluctance bars. When the third magnetic sensing mechanism is arranged in the grooves 4 that are arranged along the first direction, two third magnetic reluctance bars are positioned on the opposite side walls of the groove 4 along the first direction. When the third magnetic sensing mechanism is arranged in the grooves 4 that are arranged along the second direction, two third magnetic reluctance bars are positioned on the opposite side walls of the groove 4 along the second direction.

In one embodiment of the present disclosure, the first direction can be perpendicular to the second direction, and the third direction can be perpendicular to the plane formed by the first direction and the second direction.

In one embodiment, the first direction can be the X-axis direction of the coordinate system, and the first magnetic sensing mechanism can be X-axis magnetic sensing mechanism 1; the second direction can be the Y-axis direction of the coordinate system, and the second magnetic sensing mechanism can be Y-axis magnetic sensing mechanism 2; and the third direction can be the Z-axis direction of the coordinate system, and the third magnetic sensing mechanism can be Z-axis magnetic sensing mechanism 3.

The X-axis magnetic sensing mechanism 1 is configured to detect the magnetic field in the X-axis direction and comprises at least one X-axis magnetic reluctance bar; and the Y-axis magnetic sensing mechanism 2 is configured to detect the magnetic field in the Y-axis direction and comprises at least one Y-axis magnetic reluctance bar.

The Z-axis magnetic sensing mechanism 3 is arranged on the side wall of the groove 4 and is configured to detect the magnetic field in the Z-axis direction. The Z-axis magnetic sensing mechanism 3 comprises at least one Z-axis magnetic reluctance bar, with Z-axis magnetic reluctance bars all extending along the X-axis direction, or all extending along the Y-axis direction, or partly extending along the X-axis direction and partly extending along the Y-axis direction.

Additionally, at least one pseudo-magnetic reluctance bar 123, not connected to the Wheatstone bridge and extending along the direction of easy magnetization (such as the Y-axis direction), can be arranged between the X-axis magnetic reluctance bar and Z-axis magnetic reluctance bar which are arranged adjacent, which is configured to isolate magnetic field interference between the X-axis direction and the Z-axis direction (i.e., to isolate interference between adjacent X-axis magnetic reluctance bar and Z-axis magnetic reluctance bar).

At least one pseudo-magnetic reluctance bar 123, not connected to the Wheatstone bridge and extending along the direction of easy magnetization (such as the X-axis direction), can be arranged between the Y-axis magnetic reluctance bar and Z-axis magnetic reluctance bar which are arranged adjacent, which is configured to isolate magnetic field interference between the Y-axis direction and the Z-axis direction (i.e., to isolate interference between adjacent Y-axis magnetic reluctance bar and Z-axis magnetic reluctance bar).

Figure 3:
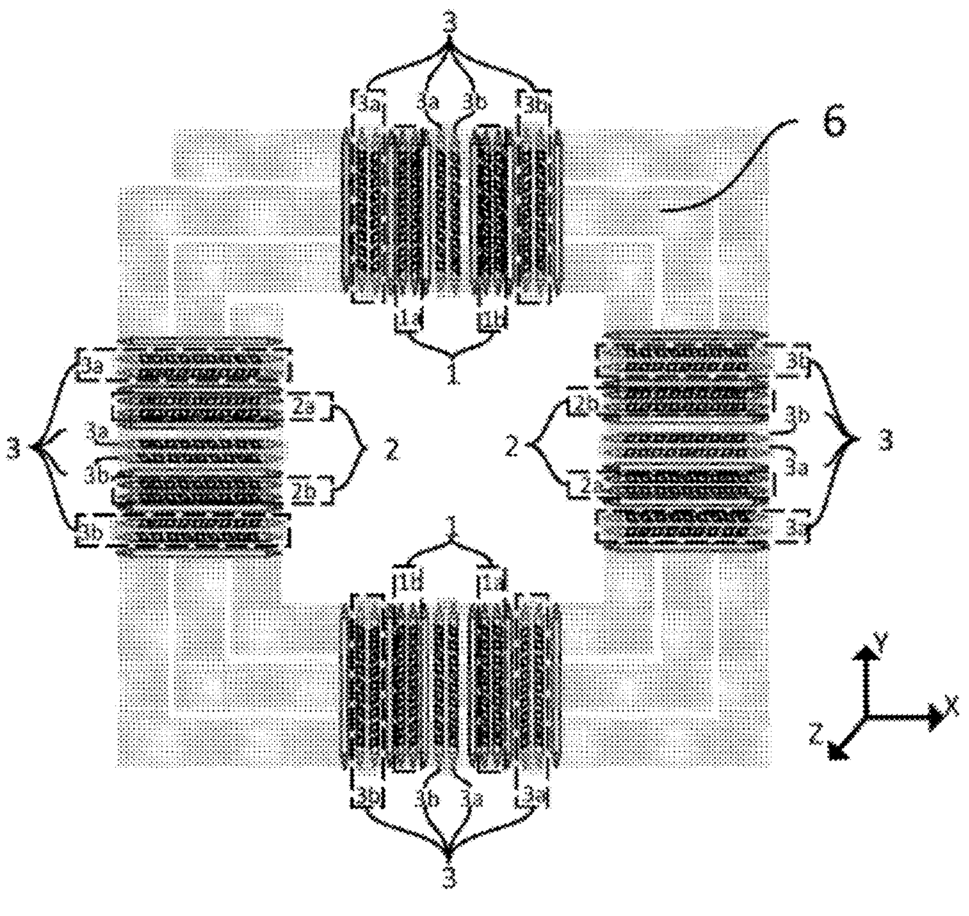
FIG. 3 shows a plan view of a triaxial magnetic sensor in an embodiment of the present disclosure.

FIG. 3 shows a plan view of a triaxial magnetic sensor in an embodiment of the present disclosure. Referring to FIG. 3, and in conjunction with FIG. 2, the X-axis magnetic sensing mechanism 1 comprises a plurality of first X-axis magnetic reluctance bars 1*a* and/or a plurality of second X-axis magnetic reluctance bars 1*b*, with each of the first X-axis magnetic reluctance bars 1*a* and each of the second X-axis magnetic reluctance bars 1*b* extending along the corresponding direction of easy magnetization (e.g., Y-axis direction). The first X-axis magnetic reluctance bar 1*a* increases in resistance values with the external magnetic field input, and the second X-axis magnetic reluctance bar 1*b* decreases in resistance value with the external magnetic field input. Specifically, in the embodiment, the X-axis magnetic sensing mechanism 1 has two types. The first X-axis magnetic sensing mechanism includes two first X-axis magnetic reluctance bars 1*a*, and the second X-axis magnetic sensing mechanism includes two second X-axis magnetic reluctance bars 1*b*.

The Y-axis magnetic sensing mechanism 2 comprises a plurality of first Y-axis magnetic reluctance bars 2*a* and/or a plurality of second Y-axis magnetic reluctance bars 2*b*, with each of the first Y-axis magnetic reluctance bars 2*a* and each of the second Y-axis magnetic reluctance bars 2*b* extending along the corresponding direction of easy magnetization (e.g., X-axis direction). The first Y-axis magnetic reluctance bar 2*a* increases in resistance values with the external magnetic field input, and the second Y-axis magnetic reluctance bar 2*b* decreases in resistance value with the external magnetic field input. Specifically, in the embodiment, the Y-axis magnetic sensing mechanism 2 has two types. The first Y-axis magnetic sensing mechanism includes two first Y-axis magnetic reluctance bars 2*a*, and the second Y-axis magnetic sensing mechanism includes two second Y-axis magnetic reluctance bars 2*b*.

The Z-axis magnetic sensing mechanism 3 comprises a plurality of first Z-axis magnetic reluctance bars 3*a* and/or a plurality of second Z-axis magnetic reluctance bars 3*b*, with each of the first Z-axis magnetic reluctance bars 3*a* and each of the second Z-axis magnetic reluctance bars 3*b* extending along the corresponding direction of easy magnetization (e.g., partly along the X-axis direction and partly along the Y-axis direction). The first Z-axis magnetic reluctance bar 3*a* increases in resistance values with the external magnetic field input, and the second Z-axis magnetic reluctance bar 3*b* decreases in resistance value with the external magnetic field input. Specifically, in the embodiment, the Z-axis magnetic sensing mechanism 3 has three types. The first Z-axis magnetic sensing mechanism includes two first Z-axis magnetic reluctance bars 3*a*, the second Z-axis magnetic sensing mechanism includes two second Z-axis magnetic reluctance bars 3*b*, and the third Z-axis magnetic sensing mechanism includes a first Z-axis magnetic reluctance bar 3*a* and a second Z-axis magnetic reluctance bar 3*b*.

Referring to FIG. 3, the grooves 4 are provided partly along the X-axis direction and partly along the Y-axis direction.

In the grooves 4 arranged along the X-axis direction, the X-axis magnetic sensing mechanism 1 is arranged between adjacent grooves 4. For example, the first X-axis magnetic sensing mechanism can be arranged between some adjacent grooves 4, and the second X-axis magnetic sensing mechanism can be arranged between some other adjacent grooves 4. The Z-axis magnetic sensing mechanism 3 is arranged inside the groove 4. For example, the first Z-axis magnetic sensing mechanism is arranged in some grooves 4, the second Z-axis magnetic sensing mechanism is arranged in some grooves 4, and additionally, the third Z-axis magnetic sensing mechanism is arranged in some other grooves 4. Specifically, the first X-axis magnetic sensing mechanism is arranged between the first Z-axis magnetic sensing mechanism and the third Z-axis magnetic sensing mechanism, thereby spacing apart the two adjacent grooves 4 corresponding to the first Z-axis magnetic sensing mechanism and the third Z-axis magnetic sensing mechanism. The second X-axis magnetic sensing mechanism is arranged between the second Z-axis magnetic sensing mechanism and the third Z-axis magnetic sensing mechanism, thereby spacing apart the two adjacent grooves 4 corresponding to the second Z-axis magnetic sensing mechanism and the third Z-axis magnetic sensing mechanism. Furthermore, the first Z-axis magnetic reluctance bar 3*a* of the third Z-axis magnetic sensing mechanism is adjacent to the first X-axis magnetic sensing mechanism, and the second Z-axis magnetic reluctance bar 3*b* of the third Z-axis magnetic sensing mechanism is adjacent to the second X-axis magnetic sensing mechanism. The first Z-axis magnetic reluctance bar 3*a* and the second Z-axis magnetic reluctance bar 3*b* within the corresponding grooves 4 extend along the Y-axis direction. Each first X-axis magnetic reluctance bar 1*a* and each second X-axis magnetic reluctance bar 1*b* extend along the Y-axis direction. In addition, a pseudo-magnetic reluctance bar 123, not connected to the Wheatstone bridge but extending along the Y-axis direction, can be arranged between the adjacent first X-axis magnetic reluctance bar 1*a* and first Z-axis magnetic reluctance bar 3*a*; and a pseudo-magnetic reluctance bar 123, not connected to the Wheatstone bridge but extending along the Y-axis direction, can be arranged between the adjacent second X-axis magnetic reluctance bar 1*b* and second Z-axis magnetic reluctance bar 3*b*.

In the grooves 4 arranged along the Y-axis direction, the Y-axis magnetic sensing mechanism 2 is arranged between adjacent grooves 4. For example, the first Y-axis magnetic sensing mechanism can be arranged between some adjacent grooves 4, and the second Y-axis magnetic sensing mechanism can be arranged between some other adjacent grooves 4. The Z-axis magnetic sensing mechanism 3 is arranged inside the groove 4. For example, the first Z-axis magnetic sensing mechanism is arranged in some grooves 4, the second Z-axis magnetic sensing mechanism is arranged in some grooves 4, and additionally, the third Z-axis magnetic sensing mechanism is arranged in some other grooves 4. Specifically, the first Y-axis magnetic sensing mechanism is arranged between the first Z-axis magnetic sensing mechanism and the third Z-axis magnetic sensing mechanism, thereby spacing apart the two adjacent grooves 4 corresponding to the first Z-axis magnetic sensing mechanism and the third Z-axis magnetic sensing mechanism. The second Y-axis magnetic sensing mechanism is arranged between the second Z-axis magnetic sensing mechanism and the third Z-axis magnetic sensing mechanism, thereby spacing apart the two adjacent grooves 4 corresponding to the second Z-axis magnetic sensing mechanism and the third Z-axis magnetic sensing mechanism. Furthermore, the first Z-axis magnetic reluctance bar 3*a* of the third Z-axis magnetic sensing mechanism is adjacent to the first Y-axis magnetic sensing mechanism, and the second Z-axis magnetic reluctance bar 3*b* of the third Z-axis magnetic sensing mechanism is adjacent to the second Y-axis magnetic sensing mechanism. The first Z-axis magnetic reluctance bar 3*a* and the second Z-axis magnetic reluctance bar 3*b* within the corresponding grooves 4 extend along the X-axis direction. Each first Y-axis magnetic reluctance bar 2*a* and each second Y-axis magnetic reluctance bar 2*b* extend along the X-axis direction. In addition, a pseudo-magnetic reluctance bar 123, not connected to the Wheatstone bridge but extending along the X-axis direction, can be arranged between the adjacent first Y-axis magnetic reluctance bar 2*a* and first Z-axis magnetic reluctance bar 3*a*; and a pseudo-magnetic reluctance bar 123, not connected to the Wheatstone bridge but extending along the X-axis direction, can be arranged between the adjacent second Y-axis magnetic reluctance bar 2*b* and second Z-axis magnetic reluctance bar 3*b*.

Figure 4:
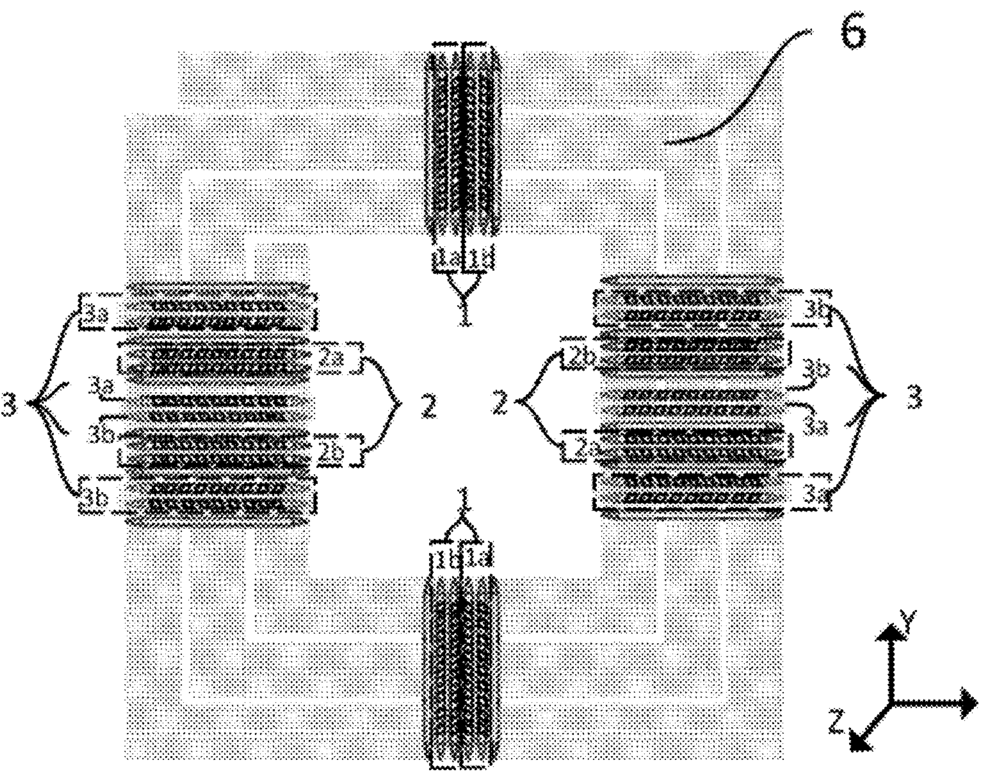
FIG. 4 shows a plan view of the triaxial magnetic sensor in another embodiment of the present disclosure.

FIG. 4 shows a plan view of the triaxial magnetic sensor in another embodiment of the present disclosure. Referring to FIG. 4, in another embodiment of the present disclosure, the grooves 4 are all provided along the Y-axis direction.

In the grooves 4 arranged along the Y-axis direction, the Y-axis magnetic sensing mechanism 2 is arranged between adjacent grooves 4. For example, the first Y-axis magnetic sensing mechanism can be arranged between some adjacent grooves 4, and the second Y-axis magnetic sensing mechanism can be arranged between some other adjacent grooves 4. The Z-axis magnetic sensing mechanism 3 is arranged inside the groove 4. For example, the first Z-axis magnetic sensing mechanism is arranged in some grooves 4, the second Z-axis magnetic sensing mechanism is arranged in some grooves 4, and additionally, the third Z-axis magnetic sensing mechanism is arranged in some other grooves 4. Specifically, the first Y-axis magnetic sensing mechanism is arranged between the first Z-axis magnetic sensing mechanism and the third Z-axis magnetic sensing mechanism, thereby spacing apart the two adjacent grooves 4 corresponding to the first Z-axis magnetic sensing mechanism and the third Z-axis magnetic sensing mechanism. The second Y-axis magnetic sensing mechanism is arranged between the second Z-axis magnetic sensing mechanism and the third Z-axis magnetic sensing mechanism, thereby spacing apart the two adjacent grooves 4 corresponding to the second Z-axis magnetic sensing mechanism and the third Z-axis magnetic sensing mechanism. Furthermore, the first Z-axis magnetic reluctance bar 3*a* of the third Z-axis magnetic sensing mechanism is adjacent to the first Y-axis magnetic sensing mechanism, and the second Z-axis magnetic reluctance bar 3*b* of the third Z-axis magnetic sensing mechanism is adjacent to the second Y-axis magnetic sensing mechanism. The first Z-axis magnetic reluctance bar 3*a* and the second Z-axis magnetic reluctance bar 3*b* within the corresponding groove 4 extend along the X-axis direction. Each first Y-axis magnetic reluctance bar 2*a* and each second Y-axis magnetic reluctance bar 2*b* extend along the X-axis direction. In addition, a pseudo-magnetic reluctance bar 123, not connected to the Wheatstone bridge but extending along the X-axis direction, can be arranged between the adjacent first Y-axis magnetic reluctance bar 2*a* and first Z-axis magnetic reluctance bar 3*a*; and a pseudo-magnetic reluctance bar 123, not connected to the Wheatstone bridge but extending along the X-axis direction, can be arranged between the adjacent second Y-axis magnetic reluctance bar 2*b* and second Z-axis magnetic reluctance bar 3*b*.

Figure 5:
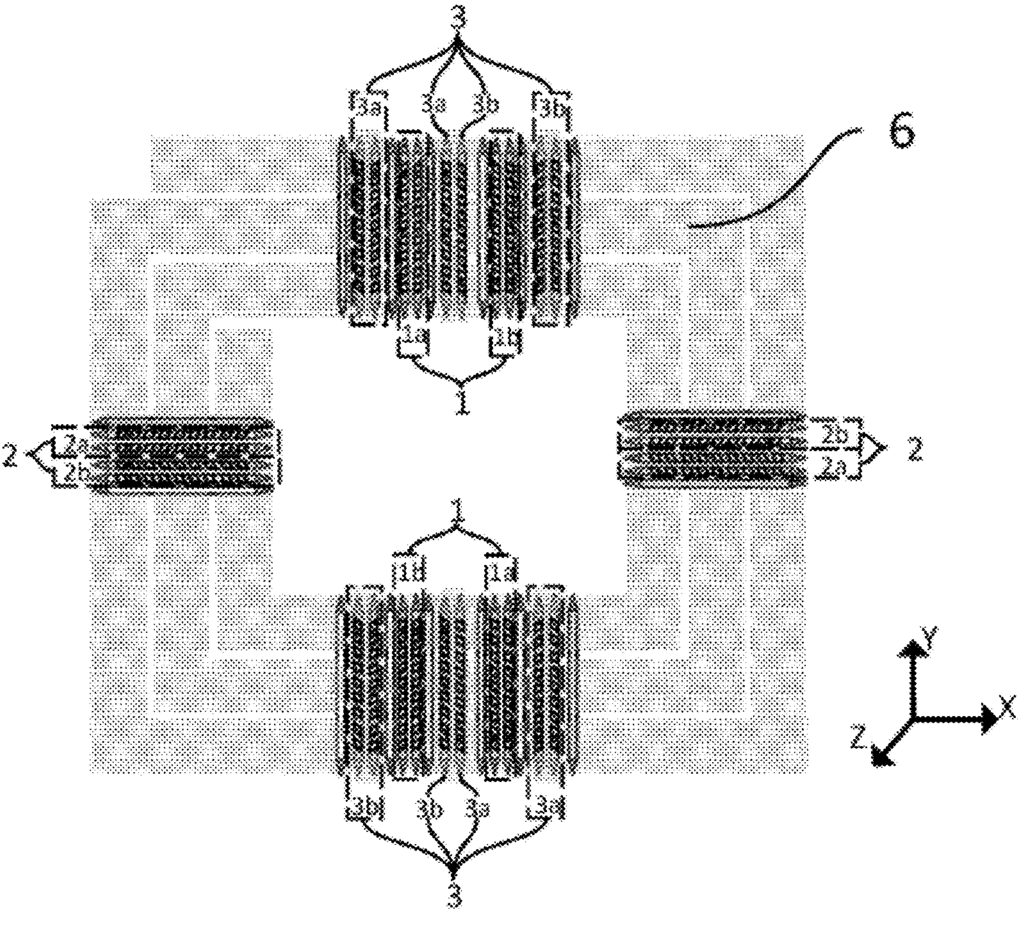
FIG. 5 shows a plan view of the triaxial magnetic sensor in another embodiment of the present disclosure.
Figure 6:
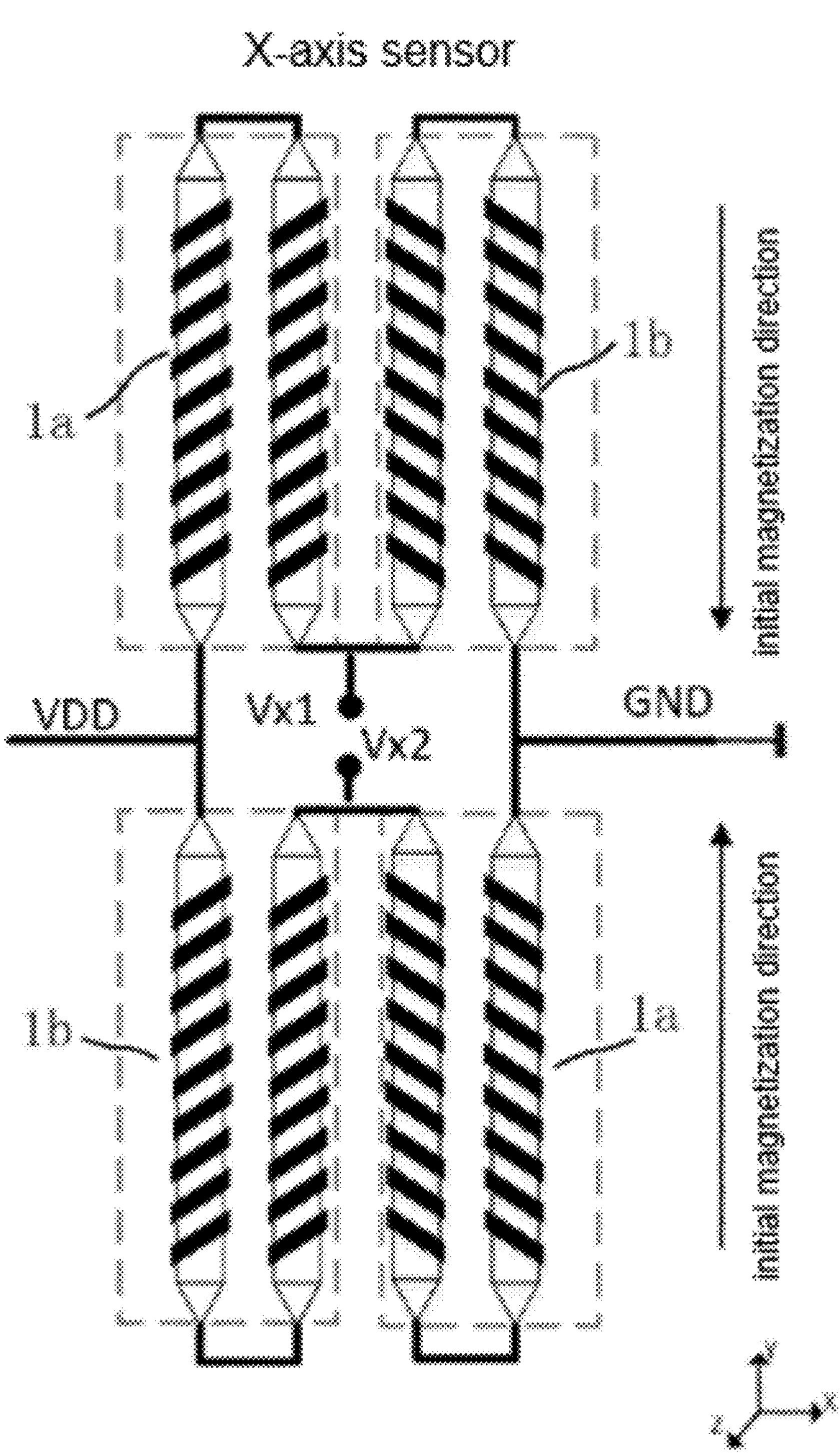
FIG. 6 shows a schematic diagram of the connection of the X-axis magnetic sensing mechanism forming a Wheatstone bridge in an embodiment of the present disclosure.
Figure 7:
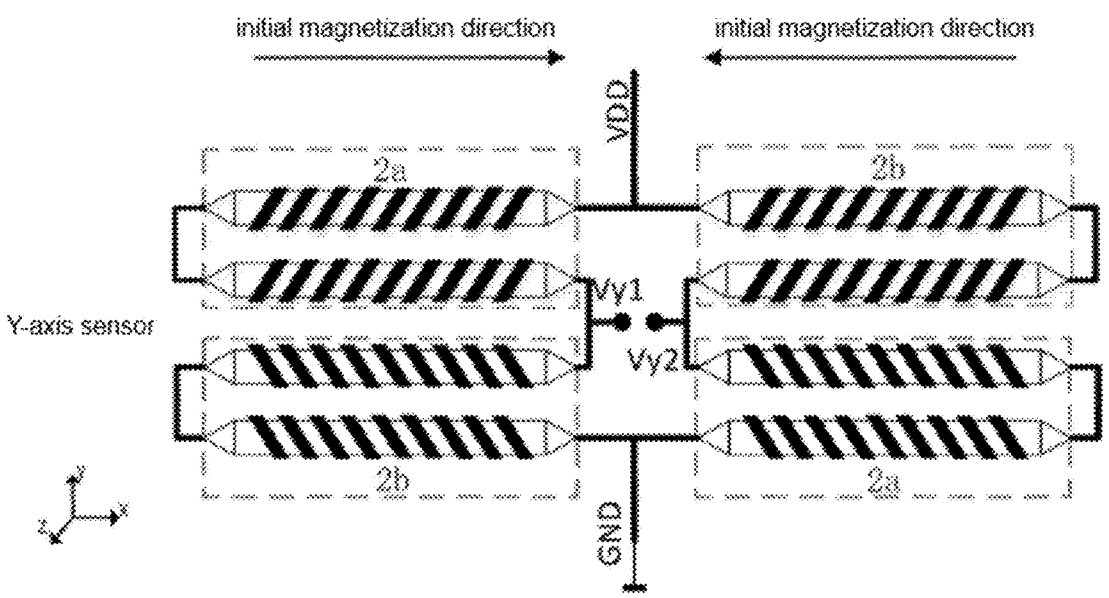
FIG. 7 shows a schematic diagram of the connection of the Y-axis magnetic sensing mechanism forming a Wheatstone bridge in an embodiment of the present disclosure.
Figure 8:
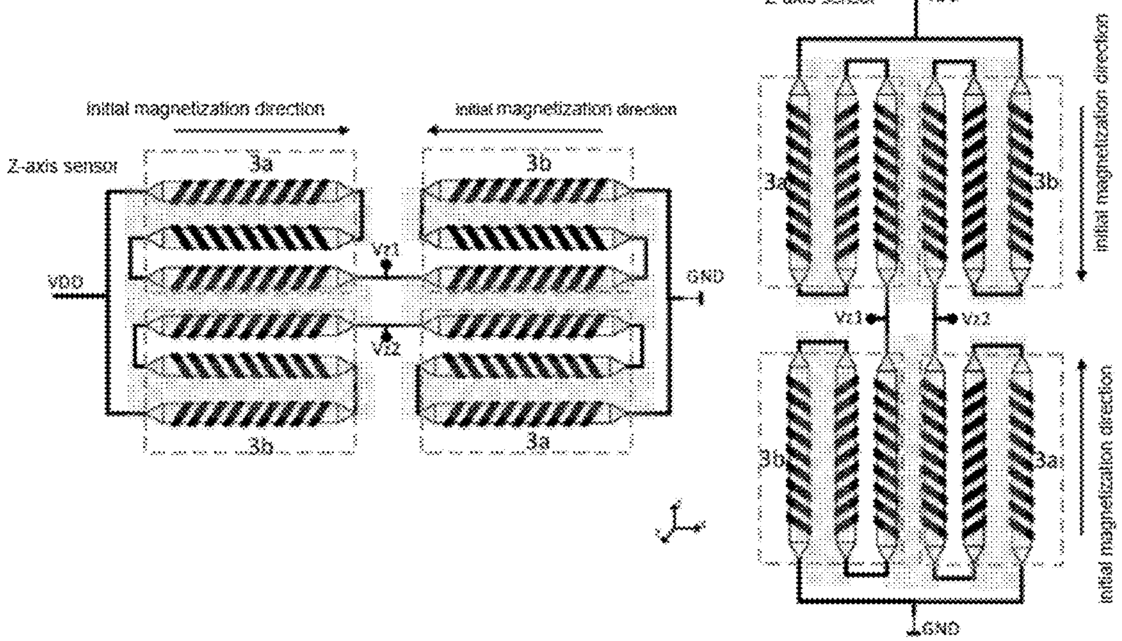
FIG. 8 shows a schematic diagram of the connection of the Z-axis magnetic sensing mechanism forming a Wheatstone bridge in an embodiment of the present disclosure.
Figure 9:
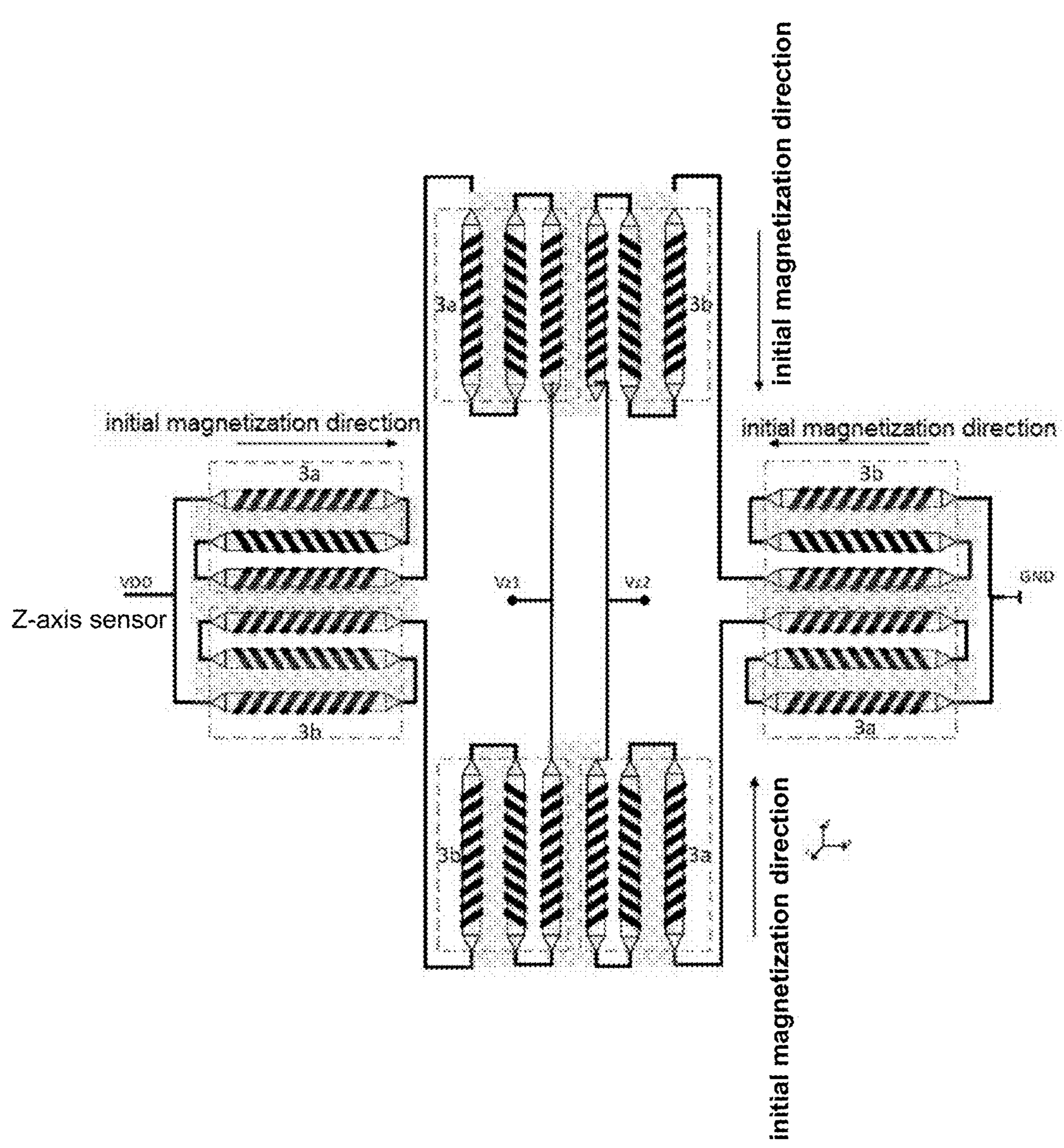
FIG. 9 shows a schematic diagram of the connection of the Z-axis magnetic sensing mechanism forming a Wheatstone bridge in another embodiment of the present disclosure.

FIG. 5 shows a plan view of the triaxial magnetic sensor in another embodiment of the present disclosure. Referring to FIG. 5, in another embodiment of the present disclosure, the grooves 4 are all provided along the X-axis direction.

In the grooves 4 arranged along the X-axis direction, the X-axis magnetic sensing mechanism 1 is arranged between adjacent grooves 4. For example, the first X-axis magnetic sensing mechanism can be arranged between some adjacent grooves 4, and the second X-axis magnetic sensing mechanism can be arranged between some other adjacent grooves 4. The Z-axis magnetic sensing mechanism 3 is arranged inside the groove 4. For example, the first Z-axis magnetic sensing mechanism is arranged in some grooves 4, the second Z-axis magnetic sensing mechanism is arranged in some grooves 4, and additionally, the third Z-axis magnetic sensing mechanism is arranged in some other grooves 4. Specifically, the first X-axis magnetic sensing mechanism is arranged between the first Z-axis magnetic sensing mechanism and the third Z-axis magnetic sensing mechanism, thereby spacing apart the two adjacent grooves 4 corresponding to the first Z-axis magnetic sensing mechanism and the third Z-axis magnetic sensing mechanism. The second X-axis magnetic sensing mechanism is arranged between the second Z-axis magnetic sensing mechanism and the third Z-axis magnetic sensing mechanism, thereby spacing apart the two adjacent grooves 4 corresponding to the second Z-axis magnetic sensing mechanism and the third Z-axis magnetic sensing mechanism. Furthermore, the first Z-axis magnetic reluctance bar 3*a* of the third Z-axis magnetic sensing mechanism is adjacent to the first X-axis magnetic sensing mechanism, and the second Z-axis magnetic reluctance bar 3*b* of the third Z-axis magnetic sensing mechanism is adjacent to the second X-axis magnetic sensing mechanism. The first Z-axis magnetic reluctance bar 3*a* and the second Z-axis magnetic reluctance bar 3*b* within the corresponding grooves 4 extend along the Y-axis direction. Each first X-axis magnetic reluctance bar 1*a* and each second X-axis magnetic reluctance bar 1*b* extend along the Y-axis direction. In addition, a pseudo-magnetic reluctance bar 123, not connected to the Wheatstone bridge but extending along the Y-axis direction, can be arranged between the adjacent first X-axis magnetic reluctance bar 1*a* and first Z-axis magnetic reluctance bar 3*a*; and a pseudo-magnetic reluctance bar 123, not connected to the Wheatstone bridge but extending along the Y-axis direction, can be arranged between the adjacent second X-axis magnetic reluctance bar 1*b* and second Z-axis magnetic reluctance bar 3*b*.

The magnitude of the external magnetic field will change the magnetization direction of the magnetic reluctance bar, thereby altering the angle between the working electrode and the magnetic reluctance bar. In other words, the angle between the direction of current in the magnetic reluctance bar and the magnetization direction of the magnetic reluctance bar corresponds to the magnitude of the external magnetic field. Each of the magnetic sensing mechanisms is combined separately to form an independent Wheatstone bridge, with each bridge arm of each Wheatstone bridge composed of at least one magnetic reluctance bar. In one embodiment, several magnetic reluctance bars with a same induction change in response to external magnetic fields form one bridge arm of a Wheatstone bridge. Two sets of bridge arms with increasing resistance values with external magnetic field input and two sets of bridge arms with decreasing resistance values with external magnetic field input together form a Wheatstone bridge (shown in FIGS. 6 to 9).

In one embodiment of the present disclosure, set/reset coils 6 are arranged above or/and below each magnetic reluctance bar to generate a magnetic field along an axis of easy magnetization; and working electrodes at a set angle to the magnetic reluctance bar are distributed on an upper surface or/and a lower surface of the magnetic reluctance bar.

The set/reset coils 6 determine the initial magnetization direction of the magnetic reluctance bar. The power supply and ground of the Wheatstone bridge, together with the electrode structure on the magnetic reluctance bar, determine the direction of current in the magnetic reluctance bar. In the initial state, the ideal value for the angle between the initial magnetization direction and the direction of current can be 45° (certainly, it can also be another value). When an external magnetic field is present, the external magnetic field changes the magnetization direction of the magnetic reluctance bar, thereby altering the angle between the magnetization direction of the magnetic reluctance bar and the direction of current. As the angle increases, the resistance of the magnetic reluctance bar decreases, and as the angle decreases, the resistance of the magnetic reluctance bar increases.

Additionally, in a local area, self-test coils 5 can be arranged based on a detection magnetic field of the magnetic reluctance bar, wherein the self-test coils 5 are configured to generate a magnetic field in the detection direction corresponding to the magnetic reluctance bar.

In one embodiment of the present disclosure, a pseudo-magnetic reluctance bar, providing no signal output for external magnetic fields, is arranged between adjacent magnetic reluctance bars. The upper or/and lower surfaces of the pseudo-magnetic reluctance bar are provided with working electrodes at a set angle to the pseudo-magnetic reluctance bar. Of course, it is also possible not to arrange working electrodes at a set angle to the pseudo-magnetic reluctance bar.

The present disclosure further discloses a manufacturing process for the triaxial magnetic sensor, wherein the manufacturing process comprises the following steps.

Step S1: arranging a silicon-based substrate or a substrate with circuits.

Step S2: forming at least two grooves on the surface of the substrate, wherein a set angle is provided between the side wall of the grooves and the surface of the substrate; arranging the grooves all along the first direction, or all along the second direction, or partly along the first direction and partly along the second direction; and leaving a mounting space between at least one pair of adjacent grooves in the grooves arranged along the first direction, and/or leaving a mounting space between at least one pair of adjacent grooves in the grooves arranged along the second direction;

Step S3: forming an insulating layer on the surface of the substrate and the grooves.

Step S4: forming the first magnetic sensing mechanism and the second magnetic sensing mechanism on a surface of the insulating layer of the substrate; forming the third magnetic sensing mechanism on a surface of the insulating layer of the grooves; and arranging at least one first magnetic sensing mechanism in the mounting space along the first direction and/or arranging at least one second magnetic sensing mechanism in the mounting space along the second direction, wherein the first magnetic sensing mechanism, the second magnetic sensing mechanism, and the third magnetic sensing mechanism all comprise magnetic materials. Each first magnetic sensing mechanism is configured to detect a magnetic field in a first direction, each second magnetic sensing mechanism is configured to detect a magnetic field in a second direction, and each third magnetic sensing mechanism is configured to detect a magnetic field in a third direction. The first direction and the second direction can form a plane and the plane corresponds to the surface of the substrate. The third direction intersects the surface of the substrate.

In one embodiment, the first direction can be the X-axis direction of the coordinate system, and the first magnetic sensing mechanism can be the X-axis magnetic sensing mechanism; the second direction can be the Y-axis direction of the coordinate system, and the second magnetic sensing mechanism can be the Y-axis magnetic sensing mechanism; and the third direction can be the Z-axis direction of the coordinate system, and the third magnetic sensing mechanism can be the Z-axis magnetic sensing mechanism.

In one embodiment of the present disclosure, the magnetic material is selected from any one of an anisotropic magnetoresistive material, a giant magnetoresistive material, and a tunnel magnetoresistive material; when forming the magnetic material, a magnetic field is simultaneously applied to the substrate for annealing so as to induce the magnetization direction of the magnetic material and enhance the magnetic properties of the magnetic material.

In one embodiment of the present disclosure, Step S4 is further followed by the following steps.

Step S41: forming a dielectric layer on the surface of the magnetic material of the first magnetic sensing mechanism, the second magnetic sensing mechanism, and the third magnetic sensing mechanism.

Step S42: forming via holes in the dielectric layer on the surface of the magnetic material.

Step S43: forming a continuous electrode layer on the surface of the substrate and the side walls of the grooves.

Step S44: patterning the electrode layer to form working electrodes on the surface of the magnetic material; and the via holes formed in the dielectric layer on the surface of the magnetic material allow the magnetic material to contact the subsequently formed working electrodes.

In addition, the manufacturing process can further comprise one or more of the following steps:

- arranging lead-out terminals at both ends of each magnetic reluctance bar on the surface of the substrate and within the grooves;
- arranging self-test coils at a bottom of the grooves, below the substrate, and below the magnetic sensing mechanisms; and
- arranging set coils or/and reset coils at a top of the grooves, above the substrate, and above the magnetic sensing mechanisms.

In conclusion, the present disclosure provides a triaxial magnetic sensor and a manufacturing process therefor, which can reduce processing errors, improve process windows, and improve overall product yields.

The various technical features of the above-mentioned embodiments can be combined arbitrarily, and for the sake of concise description, all possible combinations of the various technical features in the above-mentioned embodiments are not described. However, as long as there is no contradiction in the combination of these technical features, it should be considered within the scope of the description.

The description and application of the present disclosure herein are illustrative and are not intended to limit the scope of the present disclosure to the above embodiments. The effects or advantages involved in the embodiments may be interfered with by a variety of factors and may not be embodied in the embodiments, and the description of the effects or advantages is not intended to be a limitation of the embodiments. Deformations and alterations of the embodiments disclosed herein are possible, and substitutions of embodiments and equivalent various components are well known to those of ordinary skill in the art. It should be clear to those skilled in the art that the present disclosure may be realized in other forms, structures, arrangements, proportions, and with other components, materials, and parts without departing from the spirit or essential features of the present disclosure. Other deformations and changes may be made to the embodiments disclosed herein without departing from the scope and spirit of the present disclosure.

What is claimed is:

1. A triaxial magnetic sensor, wherein the triaxial magnetic sensor comprises:

a substrate, wherein a surface of the substrate is partially concave to form at least two grooves;

at least one first magnetic sensing mechanism, configured to detect a magnetic field in a first direction;

at least one second magnetic sensing mechanism, configured to detect a magnetic field in a second direction; and at least two third magnetic sensing mechanisms, configured to detect a magnetic field in a third direction, wherein the first direction and the second direction can form a plane, the plane corresponds to the surface of the substrate, and the third direction intersects with the surface of the substrate;

the grooves are all arranged along the first direction, or along the second direction, or partly along the first direction and partly along the second direction;

the first magnetic sensing mechanism and the second magnetic sensing mechanism are both arranged on the surface of the substrate, the third magnetic sensing mechanisms are arranged inside the grooves, and each of the third magnetic sensing mechanisms corresponds to one of the grooves;

and in the grooves arranged along the first direction, at least one first pair of adjacent grooves are separated by at least one first magnetic sensing mechanism, wherein a first mounting space is defined between each first pair of adjacent grooves, and the at least one first magnetic sensing mechanism is arranged in the first mounting space along the first direction; and/or in the grooves arranged along the second direction, at least one second pair of adjacent grooves are separated by at least one second magnetic sensing mechanism, wherein a second mounting space is defined between each second pair of adjacent grooves, and the at least one second magnetic sensing mechanism is arranged in the second mounting space along the second direction.

2. The triaxial magnetic sensor according to claim 1, wherein the first magnetic sensing mechanism comprises at least one first magnetic reluctance bar, with each first magnetic reluctance bar extending along the second direction; the second magnetic sensing mechanism comprises at least one second magnetic reluctance bar, with each second magnetic reluctance bar extending along the first direction; each of the third magnetic sensing mechanisms comprises at least one third magnetic reluctance bar, with each third magnetic reluctance bar arranged on a side wall of a corresponding groove; and third magnetic reluctance bars all extend along the first direction or extend along the second direction, or partly extend along the first direction and partly extend along the second direction.

3. The triaxial magnetic sensor according to claim 2, wherein a pseudo-magnetic reluctance bar not connected to a Wheatstone bridge is provided between the first magnetic reluctance bar and the third magnetic reluctance bar that are arranged adjacently, and/or a pseudo-magnetic reluctance bar not connected to a Wheatstone bridge is provided between the second magnetic reluctance bar and the third magnetic reluctance bar that are arranged adjacently.

4. The triaxial magnetic sensor according to claim 2, wherein set/reset coils are arranged above or/and below each magnetic reluctance bar so as to generate a magnetic field along an axis of easy magnetization; and working electrodes at a set angle to the magnetic reluctance bar are distributed on an upper surface or/and a lower surface of each magnetic reluctance bar.

5. The triaxial magnetic sensor according to claim 2, wherein each magnetic sensing mechanism is combined separately to form a Wheatstone bridge, with each bridge arm of each Wheatstone bridge composed of at least one magnetic reluctance bar; and several magnetic reluctance bars with a same induction change in response to external magnetic fields form one bridge arm of the Wheatstone bridge, and one Wheatstone bridge comprises two sets of bridge arms with increasing resistance values with external magnetic field input and two sets of bridge arms with decreasing resistance values with corresponding external magnetic field input.

6. The triaxial magnetic sensor according to claim 2, wherein in a local area, self-test coils are arranged based on a detection magnetic field of the magnetic reluctance bar, wherein the self-test coils are configured to generate a magnetic field in a detection direction corresponding to each magnetic reluctance bar.

7. A manufacturing process for a triaxial magnetic sensor, wherein the manufacturing process comprises:

arranging a silicon-based substrate or a substrate with circuits;

forming at least two grooves on a surface of the substrate, wherein a set angle is provided between a side wall of the grooves and the surface of the substrate; arranging the grooves all along a first direction, or all along a second direction, or partly along the first direction and partly along the second direction; leaving a first mounting space between at least one pair of adjacent grooves in the grooves arranged along the first direction, and/or leaving a second mounting space between at least one pair of adjacent grooves in the grooves arranged along the second direction; and forming a plane by the first direction and the second direction, with the plane corresponding to the surface of the substrate;

forming an insulating layer on surfaces of the substrate and the grooves; and forming a first magnetic sensing mechanism and a second magnetic sensing mechanism on a surface of the insulating layer of the substrate; forming third magnetic sensing mechanisms on a surface of the insulating layer of the grooves; and arranging at least one first magnetic sensing mechanism in the first mounting space along the first direction and/or arranging at least one second magnetic sensing mechanism in the second mounting space along the second direction, wherein the first magnetic sensing mechanism, the second magnetic sensing mechanism, and the third magnetic sensing mechanisms all comprise magnetic materials.

8. The manufacturing process according to claim 7, wherein the manufacturing process further comprises:

forming a dielectric layer on a surface of the magnetic materials of the first magnetic sensing mechanism, the second magnetic sensing mechanism, and the third magnetic sensing mechanisms;

forming via holes in the dielectric layer on the surface of the magnetic materials;

forming a continuous electrode layer on the surface of the substrate and the side wall of the grooves; and patterning the electrode layer to form working electrodes on the surface of the magnetic materials, and the via holes formed in the dielectric layer on the surface of the magnetic materials allow the magnetic materials to contact the subsequently formed working electrodes.

9. The manufacturing process according to claim 7, wherein the magnetic materials are selected from any one of an anisotropic magnetoresistive material, a giant magnetoresistive material, and a tunnel magnetoresistive material, wherein when forming the magnetic materials, a magnetic field is simultaneously applied to the substrate for annealing so as to induce a magnetization direction of the magnetic materials and enhance magnetic properties of the magnetic materials.

10. The manufacturing process according to claim 8, wherein the manufacturing process further comprises:

arranging lead-out terminals at both ends of magnetic reluctance bars on the surface of the substrate and within the grooves;

arranging self-test coils at a bottom of the grooves, below the substrate, and below the magnetic sensing mechanisms; and arranging set coils or/and reset coils at a top of the grooves, above the substrate, and above the third magnetic sensing mechanisms.

* * * * *